United States Patent
Dietz

(10) Patent No.: US 7,208,952 B2
(45) Date of Patent: Apr. 24, 2007

(54) MAGNETIC RESONANCE DEVICE COMPRISING AN EDDY-CURRENT GENERATOR

(75) Inventor: Peter Dietz, Nürnberg (DE)

(73) Assignee: Siemens Aktiengesellschaft, Munich (DE)

( * ) Notice: Subject to any disclaimer, the term of this patent is extended or adjusted under 35 U.S.C. 154(b) by 19 days.

(21) Appl. No.: 10/501,175

(22) PCT Filed: Dec. 19, 2002

(86) PCT No.: PCT/DE02/04675

§ 371 (c)(1),
(2), (4) Date: Jul. 9, 2004

(87) PCT Pub. No.: WO03/058265

PCT Pub. Date: Jul. 17, 2003

(65) Prior Publication Data

US 2005/0030027 A1 Feb. 10, 2005

(30) Foreign Application Priority Data

Jan. 11, 2002 (DE) ................. 102 00 861

(51) Int. Cl.
G01V 3/00 (2006.01)
(52) U.S. Cl. ..................................... 324/318
(58) Field of Classification Search .................. None
See application file for complete search history.

(56) References Cited

U.S. PATENT DOCUMENTS

| | | | |
|---|---|---|---|
| 5,617,026 A | | 4/1997 | Yoshino et al. |
| 5,708,360 A | * | 1/1998 | Yui et al. ................. 324/318 |
| 5,764,059 A | * | 6/1998 | Mansfield et al. .......... 324/318 |
| 5,952,829 A | * | 9/1999 | Melcher et al. ............. 324/318 |
| 6,147,494 A | * | 11/2000 | Ham ......................... 324/318 |
| 6,384,604 B2 | * | 5/2002 | Heid .......................... 324/318 |
| 6,437,568 B1 | * | 8/2002 | Edelstein et al. ........... 324/318 |
| 6,552,543 B1 | | 4/2003 | Dietz |
| 6,618,611 B2 | * | 9/2003 | Gebhardt ..................... 600/422 |
| 6,661,229 B2 | * | 12/2003 | Weyers et al. ............... 324/318 |
| 6,831,461 B2 | * | 12/2004 | Arz et al. .................... 324/318 |
| 2003/0206015 A1 | * | 11/2003 | Feiweier ..................... 324/309 |

FOREIGN PATENT DOCUMENTS

| | | |
|---|---|---|
| DE | OS 198 43 905 | 4/2000 |
| DE | PS 198 59 501 | 6/2000 |

OTHER PUBLICATIONS

Patent Abstracts of Japan, Publication No. 09308617, for Application No. 08127120.
"Vibration Control of a Cylindrical Shell Used in MRI Equipment," Qiu et al., Smart. Mater. Struct., vol. 4, (1995), pp. A75-A81.

* cited by examiner

Primary Examiner—Diego Gutierrez
Assistant Examiner—Dixomara Vargas
(74) Attorney, Agent, or Firm—Schiff Hardin LLP

(57) ABSTRACT

The invention relates to a magnetic resonance device comprising a magnet that generates a base magnetic field, at least one eddy-current generator and at least one electrically conductive structure, in which eddy currents can be produced by means of the eddy-current generator, in such a way that Lorentz forces act on the structure in the base magnetic field. The structure is equipped with a force generator, which is configured and controlled in such a way that it generates forces which counteract the Lorentz forces, thus preventing a displacement and deformation of the structure.

11 Claims, 3 Drawing Sheets

MAGNETIC RESONANCE DEVICE COMPRISING AN EDDY-CURRENT GENERATOR

BACKGROUND OF THE INVENTION

1. Field of the Invention

The present invention is directed to a magnetic resonance apparatus, and in particular to a magnetic resonance apparatus of the type having an arrangement for preventing disturbances arising due to Lorentz forced produced by eddy currents from having a disturbing effect, such as noise generation of image quality degradation.

2. Description of the Prior Art

Magnetic resonance technology is a known technology to, among other things, acquire images of the inside of a body of an examination subject. For this purpose, in a magnetic resonance apparatus rapidly switched gradient fields that are generated by a gradient coil system are superimposed on a static basic magnetic field that is generated by a basic field magnet. The magnetic resonance apparatus also has a radio-frequency system that emits radio-frequency signals into the examination subject in order to produce magnetic resonance signals, and acquires the generated magnetic resonance signals on the basis of which magnetic resonance images are created.

A superconducting basic field magnet includes, for example, an essentially hollow-cylindrical helium vessel in which superconducting coils are arranged that are cooled by the fluid helium surrounding them. The helium vessel is enclosed by a hollow-cylindrical inner cryoshield that is in turn enclosed by a hollow-cylindrical outer cryoshield. The cryoshields are fashioned from a metal with good heat conductivity, for example aluminum. The cryoshields and/or the helium vessel are thereby kept at predeterminable temperatures by cryo-coolers, cold gas or liquid nitrogen. The outer cryoshield is ultimately enclosed by an essentially hollow-cylindrical vacuum vessel. The vessels are normally fashioned from non-magnetic stainless steel. The helium vessel is connected with the inner cryoshield, both cryoshields are interconnected, and the outer cryoshield is connected with the vacuum vessel. All connections are made in a minimally heat-conductive manner at a mutual separation of a few millimeters up to a few centimeters.

A hollow-cylindrical gradient coil system is attached in the cylindrical hollow of the vacuum vessel, for example by wedging into the hollow. To generate gradient fields, suitable currents are set in the gradient coil. The amplitudes of the required currents amount to more than 100 A. The current rise and fall rates amount to more than 100 kA/s. The basic magnetic field is on the order of IT and interacts with these temporally changing currents in the gradient coil and produces Lorentz forces, which lead to oscillations of the gradient coil system and therewith to unwanted acoustic noises and image quality interferences.

German OS 44 32 747 teaches an active measure for, in principle, reducing oscillations of the gradient coil system in a magnetic resonance apparatus.

For this, an apparatus, in particular employing electrostrictive elements, is arranged in or on the gradient coil system. With this apparatus, forces can be generated that counteract the oscillations of the gradient coil system, such that a deformation of the gradient coil system is substantially prevented. The electrostrictive elements are appropriately controlled for this purpose by an electrical voltage applied to them.

The gradient coil system normally is surrounded by conductive structures in which eddy currents are induced by the switched gradient fields. Examples of such conductive structures are the vacuum vessel and/or the cryoshields of the superconducting basic field magnet, a radio-frequency shield, for example made from a copper foil, and the antenna of the radio-frequency system. The fields as a consequence of the eddy currents are unwanted because without countermeasures they weaken the gradient fields and distort their time curve, which leads to impairment of the quality of magnetic resonance images.

The distortion of a gradient field as a result of the eddy current fields can be compensated to a certain degree by a suitable predistortion of a quantity controlling the gradient field. To compensate, the controlling quantity is filtered such that eddy current fields ensuing given non-predistorted operation of the gradient coil are cancelled by the predistortion. A filter network can be used for this filtering the parameters of which are determined by the time constants and coefficients that, for example, can be determined with a method described in German Patent 198 59 501.

By the use of an actively shielded gradient coil system, the eddy currents induced by the gradient coils fed with current (these eddy currents being on a predeterminable enveloping surface that, for example, runs through the inner cylinder jacket of the 80 K cryoshield of the superconducting basic field magnet) also can be reduced.

Furthermore, a radio-frequency shield provided with dividing slits is known from German OS 198 43 905 for a magnetic resonance apparatus. The radio-frequency shield, among other things, is slotted such that the eddy currents induced by the gradient fields in the radio-frequency shield are optimally suppressed.

SUMMARY OF THE INVENTION

An object of the present invention is to provide an improved magnetic resonance apparatus in which, among other things, unwanted eddy current effects are better controlled.

The above object is achieved in accordance with the principles of the present invention in magnetic resonance apparatus having a basic field magnet that generates a basic magnetic field, at least one eddy current generator, at least one electrically conductive structure in which eddy currents arise due to the eddy current generator and that interact with the basic magnetic field to produce Lorentz forces, and having a force generator attached to the electrically conductive structure that is designed and controlled to generate forces counteracting the aforementioned Lorentz forces so that no movement and deformation of the electrically conductive structure arises.

As used herein, the design and control of the force generator so that movement and deformation of the electrically conductive structure do not arise means that such movement and/or deformation is prevented, as much as possible, from ever beginning to occur. The phrase does not mean that such movement and/or deformation, after they have already occurred, are counteracted.

The invention is based on the recognition that, due to the switched gradient fields, eddy currents are induced in a conductive structure and these eddy currents interact with the basic magnetic field to produce Lorentz forces such that the conductive structure is also excited to oscillations, which leads to induction of further eddy currents and therewith as a consequence to further oscillations, and so forth. Once the conductive structure has been driven into oscillations, damping of these oscillations is possible only be means of a sophisticated sensor-actuator combination, since these oscillations depend on the resonant behavior of the conductive structure and are determined by the further eddy currents. According to the invention, aforementioned complexity is prevented by attaching a force generator to the conductive structure, the force generator being fashioned such that it generates forces that counteract those forces that act on the eddy currents generated by the gradient fields in the conductive structure. Movement and/or oscillation of the conductive structure thus is prevented from the outset. It is advantage that the gradient fields are spatially constant and can be scaled directly with for currents the individual gradient axes flowing in the gradient coils, such that the eddy currents thereby excited proceeding exact predictable paths or paths that can be measured once that, as the case may be, exhibit different decay curves. This also affords the possibility of a simple control of the force generator based on a temporal current curve in the gradient coils, in particular a portion of the eddy current-compensating predistortion corresponds to a portion and time curve of the eddy currents.

DESCRIPTION OF THE PREFERRED EMBODIMENTS

Figure 1:
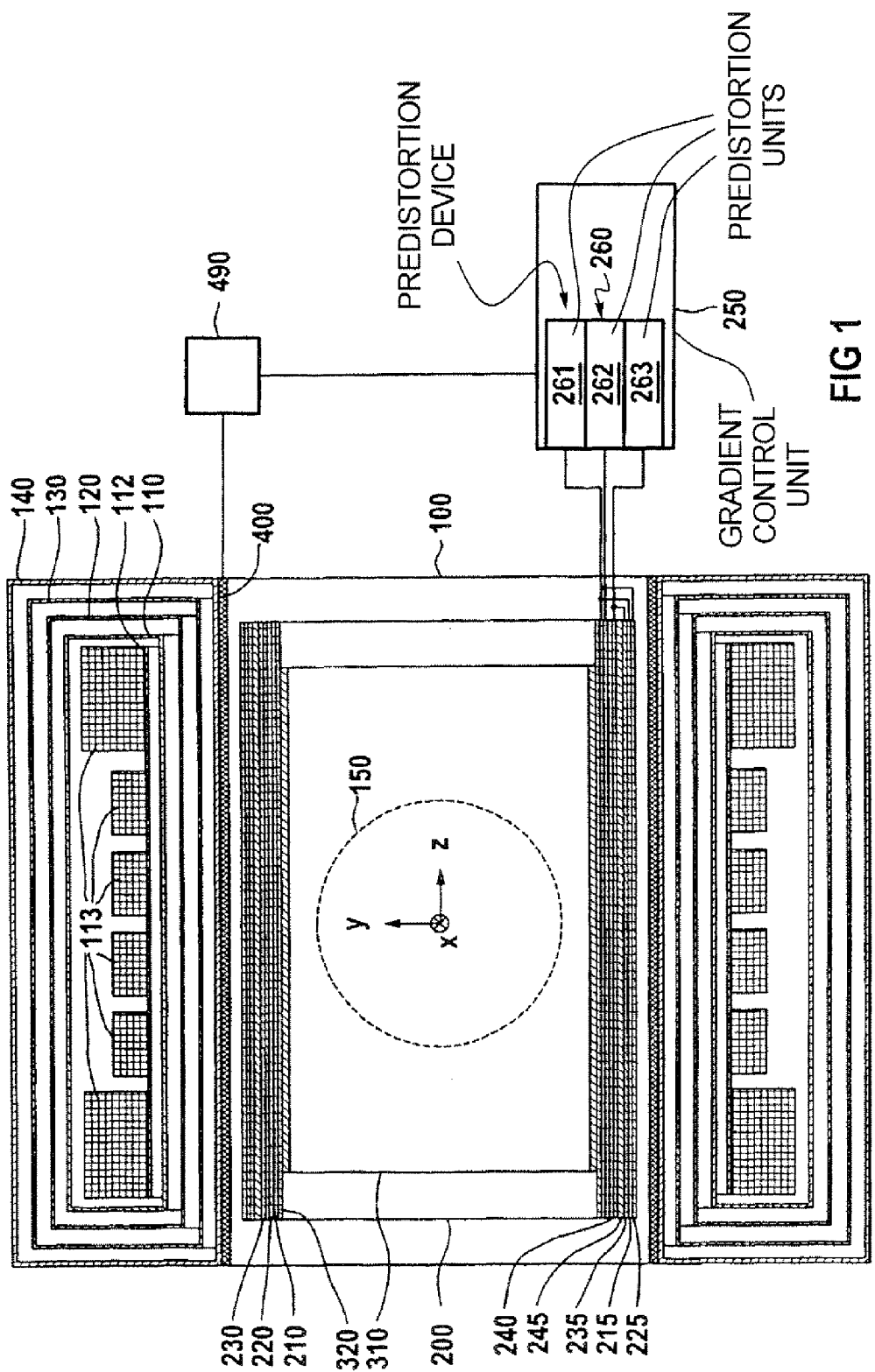
FIG. 1 is a longitudinal section through a magnetic resonance apparatus with a gradient coil and a force generator in accordance with the present invention.

As an exemplary embodiment of the invention, FIG. 1 shows a longitudinal section through a magnetic resonance apparatus. The magnetic resonance apparatus has an essentially hollow-cylindrical basic field magnet 100 with which, at least within an imaging volume 150 of the magnetic resonance apparatus, an optimally homogenous static basic magnetic field can be generated. The basic field magnet 100 has an essentially hollow-cylindrical helium vessel 100 made of non-magnetic stainless steel, in which superconducting solenoid coils 113 are arranged on a winding carrier, these solenoid coils 113 being cooled to 4.2 K by the liquid helium surrounding them.

The helium vessel 110 is enclosed by a hollow-cylindrical 20 K cryoshield 120 that is in turn enclosed by a hollow-cylindrical 80 K cryoshield 130. The cryoshields 120 and 130 allow very little radiant heat to reach the helium vessel 110 from the outside and are fashioned from a metal with good heat conductivity. By means of cry-coolers, cold gas or liquid nitrogen, the 20 K cryoshield is kept at a temperature of 20 K and the 80 K cryoshield is kept at a temperature of 80 K.

The 80 K cryoshield is enclosed by an essentially hollow-cylindrical vacuum vessel 140 made from non-magnetic stainless steel. The helium vessel 110 is connected with the 20 K cryoshield 120, both cryoshields 120 and 130 are interconnected, and the 80 K cryoshield 130 is connected with the vacuum vessel 140, in a poorly heat-conductive manner at a mutual separation of a few millimeters up to a few centimeters, for example via thin fiberglass rods.

The magnetic resonance apparatus also has a gradient coil system 200 composed of gradient coils and associated shielding coils and with which a gradient control unit 250 is associated. The essentially hollow-cylindrical gradient coil system 200 is attached in the cylindrical hollow of the vacuum vessel 140 by wedging.

To control the currents in the coils, the gradient coil system 200 is connected with the gradient control unit 250. Within the imaging volume 150, rapidly switched magnetic gradient fields can be superimposed on the basic magnetic field with the gradient coil system 200 fed with current.

The gradient coil system 200 includes, from the inside out, the following hollow-cylindrical regions 210 through 245 that are arranged concentrically relative to one another: a first hollow-cylindrical region 210 contains an x-gradient coil to generate an x-gradient field with a gradient collinear to the x-axis of a Cartesian coordinate system. A second hollow-cylindrical region 220 contains a y-gradient coil to generate a y-gradient field with a gradient collinear to the y-axis. The x- and y-gradient coils each are composed of four partial coils fashioned saddle-shaped. A third hollow-cylindrical region 240 contains a cooling device to, among other things, cool the gradient coils. A fourth hollow-cylindrical region 230 contains a z-gradient coil to generate a z-gradient field with a gradient collinear to the z-axis. The z-gradient coil, for example, is composed of two solenoid partial coils.

A fifth hollow-cylindrical region 245 contains active and/or passive shim devices and a further cooling device. A z-shielding coil associated with the z-gradient coil is arranged in a sixth hollow-cylindrical region 235. A seventh hollow-cylindrical region 215 contains an x-shielding coil that is associated with the x-gradient coil. Finally, an eighth hollow-cylindrical region 225 contains a y-shielding coil that is associated with the y-gradient coil.

The shielding coils respectively associated with the gradient coils are fashioned and are supplied with current such that the magnetic fields that are generated with the shielding coils compensate the magnetic fields that are generated with the associated gradient coils on the inner cylinder jacket of the 80 K cryoshield 130, at least such that fewer eddy currents are induced in the inner cylinder jacket by the gradient coil system 200 fed with current composed to a gradient coil system without shielding coils.

So that the switched gradient fields in the imaging volume 150 are not distorted by eddy current induction and eddy current magnetic fields as a consequence thereof, the gradient control unit 250 operates with correspondingly predistorted control quantities for the currents of the gradient coils and associated shielding coils. For this purpose, the gradient control unit 250 has a predistortion device 260 that includes respective predistortion units 261, 262 and 263 for each of the three gradient axes x, y and z.

Furthermore, to radiate radio-frequency signals into an examination subject positioned in the imaging volume 150, as well as to acquire magnetic resonance signals from the examination subject, the magnetic resonance apparatus has an antenna 310. A radio-frequency shield 320 is disposed between the antenna 310 and the gradient coil system 200 to shield from exterior interfering influences.

Furthermore, the magnetic resonance apparatus has a force generator 400 that, as a hollow cylinder of small wall thickness, is attached like a layer to the inner cylinder jacket of the vacuum reservoir 140. Due to the switched gradient fields, in the inner cylinder jacket of the vacuum reservoir 140 eddy currents are induced that interact with the basic magnetic field to produce Lorentz forces, such that (without countermeasures) deformation, movement and/or oscillation of the inner cylinder jacket would result. The force generator 400 is fashioned and can be controlled such that the force generator 400 can generate forces counteracting the aforementioned Lorentz forces, such that the deformation, movement and/or oscillation of the inner cylinder jacket is prevented (i.e., never arises). For control of the force generator 400, a force generator control unit 490 is associated with the force generator 400. The force generator control unit 490 is linked with the gradient control unit 250, in particular its predistortion device 260. The predistortion of the coil currents can be used to control the force generator 400, since the predistortion mirrors the precise portion and the time curve of the eddy currents.

Figure 2:
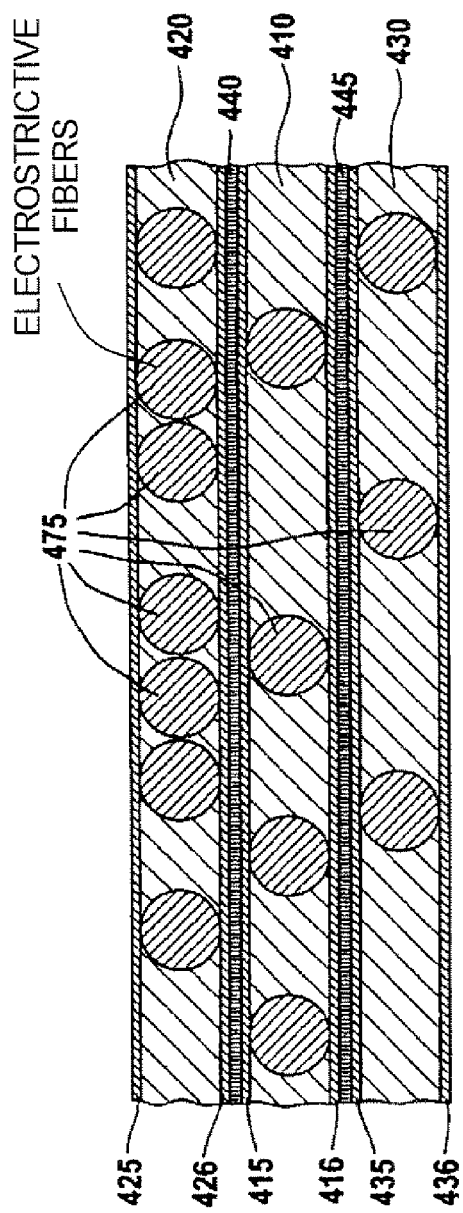
FIG. 2 is a longitudinal section taken through the inventive force generator, in a first embodiment.

As an exemplary embodiment of the invention, FIG. 2 shows in sections a detailed longitudinal section through the force generator 400 in a first embodiment. The force generator 400 is formed by three layers 410, 420 and 430 in which electrostrictive fibers 475 or bundles of such fibers are arranged. The electrostrictive fibers 475 are arranged in the layer 430 corresponding to the spatial distribution of the Lorentz forces (that are caused by the z-coils fed with current) acting on the inner cylinder jacket of the vacuum reservoir 140. In the layers 420 and 410 the electrostrictive fibers 475 are arranged corresponding to the Lorentz forces caused by the x- and y-coils fed with current. A very fine spatial resolution thus can be achieved with the electrostrictive fibers 475.

In other embodiments, instead of the fibers 475, electrostrictive elements that are fashioned foil-like, plate-like and/or stack-like can be used, as well as magnetostrictive and/or hydraulic force generators.

The electrostrictive fibers 475 are respectively arranged per layer 410, 420 and 430 between two contacting layers 415 and 416, 425 and 426 and 435 and 436. Electrically-insulating layers 440 and 445 are arranged between the contacting layers 426 and 415 as well as 416 and 425. Between the contacting layers 415 and 416, 425 and 426 and 435 and 436, electrical voltages can be applied that effect a contradiction of the electrostrictive fibers 475 and therewith a force is produced perpendicular to the surface of the inner cylinder jacket of the vacuum vessel 140.

The electrical voltages are provided by the force generator control unit 490, whereby the layer 420 is controlled by the predistortion unit 262 corresponding to a predistortion for the y-coils, the layer 410 is controlled by the predistortion unit 261 corresponding to a predistortion for the x-coils, and the layer 430 is controlled by the predistortion unit 263 corresponding to a predistortion for the z-coils.

Figure 3:
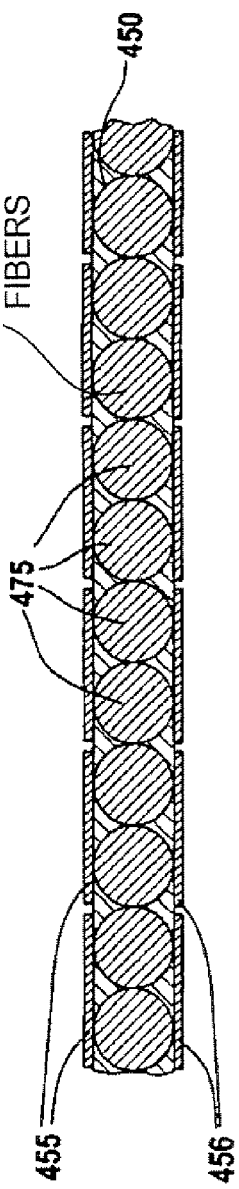
FIG. 3 is a longitudinal section taken through the inventive force generator, in a second embodiment.

As a further exemplary embodiment of the invention, FIG. 3 shows in sections a detailed longitudinal section through the force generator 400. Electrostrictive fibers 475 are uniformly distributed in a layer 450. The layer 450 is disposed between two contacting layers 455 and 456, with both contacting layers 455 and 456 being divided in a congruent manner into sub-contacts. The partial sub-contacts are insulated from one another and cover the layer 450 like tiles. Two sub-contacts that are opposite one another relative to the layer 450 form a pair. With the force generator control unit 490, electrical voltages can be applied to each of the pairs, with the voltage for each pair being adjustable independently of the voltages for the other pairs. In the layer 450, corresponding regions of one or more of the electrostrictive fibers 475 thus can be controlled independently of one another and with different contractions.

Compared to the first embodiment, the layer thickness of the force generator 400 is reduced so that the many sub-contacts can be controlled separately with different voltages. For an equally effective control as in the first embodiment, the predistortions of the individual predistortion units 261, 262, 263 need not be used directly, but rather are first further processed in the force generator control unit 490 and transferred to the individual sub-contacts. For this further processing, in principle the Lorentz force spatial distributions that each of the coils causes on the inner cylinder jacket of the vacuum reservoir 140 are determined, for example by measuring, and to be stored in the force generator control unit 490. Furthermore, in the second embodiment, due to the many sub-contacts, spatially different decay times of eddy currents that predominate in different regions of the inner cylinder jacket can be produced by a suitable control.

In other embodiments, the first and the second embodiment are combined with one another. Thus, for example, aforementioned different decay times in the first embodiment are produced, by the contacting layers 415, 416, 425, 426, 435 and 436 being divided into at least a few sub-contacts.

The additional weight of the force generator 400 does not change the Lorentz forces occurring in the inner cylinder jacket of the vacuum reservoir 140, and the thin, conductive contacting layers 415, 416, 425, 426, 435, 436, 455 and 456 of the force generator 400, that represent a conductive structure for eddy current induction, at most change the amplitude of the Lorentz forces to be compensated on the inner cylinder jacket.

For fine tuning in the force generator control unit 490, in addition to the stored information and the information from the predistortion unit 260, the magnetic fields generated by the individual gradient coils and associated shielding coils and causing eddy currents also can be at least selectively measured and supplied to the force generator control unit 490 as a scaling quantity. It is sufficient to record only the radially directed components of the magnetic fields, since only these cause eddy currents. Of these thusly excited eddy currents, only the currents in the circumferential direction are significant, since these produce Lorentz forces in the radial direction, which (without the countermeasure of the force generator 400) would lead to oscillations of the vacuum vessel 140, and thus noise and further secondary eddy currents would be caused.

Figure 4:
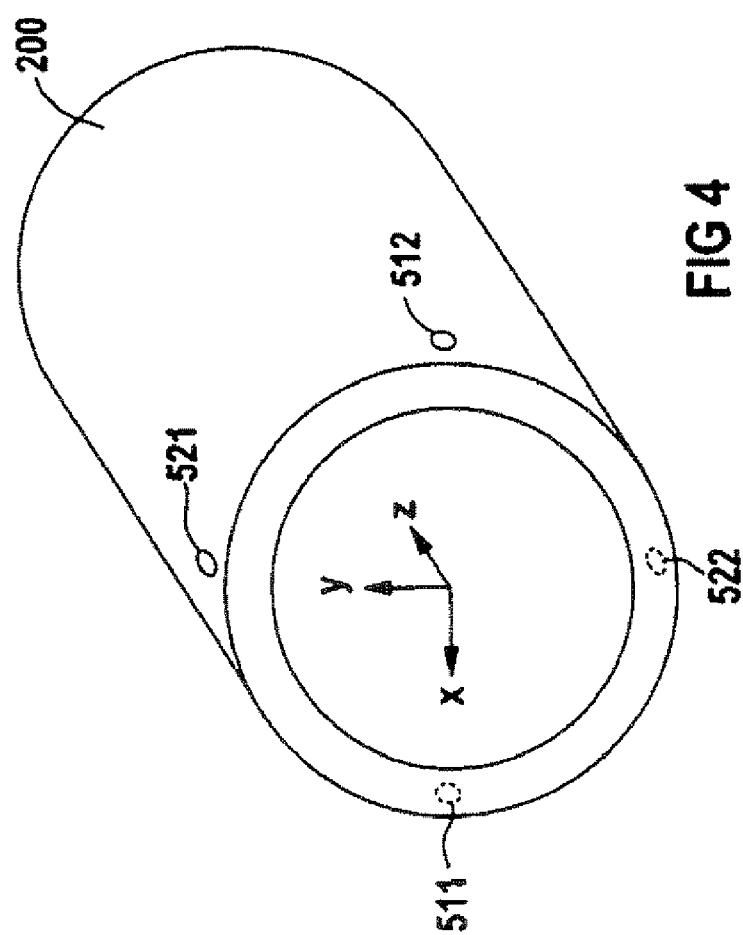
FIG. 4 is a perspective view of the gradient coil system with four annular coils to detect magnetic fields of the gradient coil system, used in accordance with the present invention.

FIG. 4 shows a perspective view of the gradient coil system 200 with four annular coils 511, 512, 521 and 522 attached to the gradient coil system 200, for making the aforementioned measurement. The annular coils 511, 512, 521 and 522 are identically positioned relative to the z-direction, the annular coils 511 and 512 are arranged in a y-z plane, and the other annular coils 521 and 522 are arranged in an x-z plane.

The annular coils 511 and 512 are disposed in a region of the gradient coil system 200 in which, due to their symmetry properties independent of their operating state, the y-coils produce radially-directed magnetic field components. The annular coils 521 and 522 are arranged in a corresponding region of the x-coils. The four annular coils 511, 512, 521 and 522 can be sufficiently separated from one another in order to detect the radially-directed magnetic field components of the gradient coils and associated shielding coils corresponding to the individual axes x, y and z. Thus, for example, an equally large signal on all annular coils 511, 512, 521 and 522 means that only the z-coils produce a radially-directed magnetic field component. In contrast to this, if the signals of both of the annular coils 511 and 512 are different, this thus means that the difference falls on a radially-directed magnetic field component of the x-coils. A difference between the signals of the two annular coils 521 and 522 thereby characterizes a contribution from the y-coils.

Figure 5:
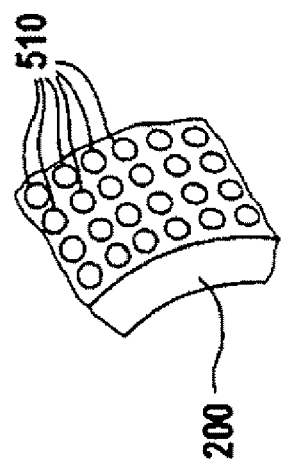
FIG. 5 is a perspective view of a portion of the gradient coil system with an area-covering arrangement of gradient coils, for use in the inventive apparatus.

As a further exemplary embodiment of the invention, FIG. 5 shows an area-covering arrangement of annular coils 510 on the surface of the gradient coil system 200. Each of the annular coils 510 is disposed, for example, corresponding to the sub-contacts of FIG. 3 and is associated with one of the sub-contacts. Similar to the annular coils 511, 512, 521 and 522 of FIG. 5, the annular coils 510 are fashioned only to detect radially-directed magnetic field components. The respectively associated sub-contact can be controlled with the measurement signal of each one of the annular coils 510. Control on the basis of the predistortion, and likewise a separation of the magnetic field components with regard to the x, y and z axes, can be foregone.

In other embodiments, instead of annular coils other sensors can be used that are sensitive to the magnetic fields generated by the gradient coils and associated shielding coils and in particular not sensitive to vibrations, for example Hall probes.

In a further embodiment, the eddy currents occurring in the cylinder jacket of the vacuum reservoir or in the contacting layers 455 or 456 are detected directly and are used to control the force generator 400 in the second embodiment according to FIG. 3. Since the eddy currents are detected exclusively, and the magnetic fields of the gradient coils and associated shielding coils should not be detected as well, the eddy currents can be detected, for example, based on their thermal effect, with the detection results being transduced into corresponding electrical voltages for the sub-contacts.

Although modifications and changes may be suggested by those skilled in the art, it is the invention of the inventor to embody within the patent warranted heron all changes and modifications as reasonably and properly come within the scope of his contribution to the art.

The invention claimed is:

1. A magnetic resonance apparatus comprising:
   a basic field magnet for generating a basic magnetic field;
   at least one eddy current generator;
   at least one electrically conductive structure, other than said eddy current generator, in which eddy currents caused by said eddy current generator can occur, said eddy currents interacting with said basic magnetic field to produce Lorentz forces; and
   a force generator attached to said at least one electrically conductive structure, said force generator being designed and controlled for mechanically applying forces to said electrically conductive structure to counteract said Lorentz forces to substantially preclude movement and deformation of said electrically conductive structure due to said Lorentz forces from occurring.

2. A magnetic resonance apparatus as claimed in claim 1 wherein said eddy current generator has a control unit associated therewith, and wherein said force generator comprises a control unit for operating said force generator dependent on operation of said control unit for said eddy current generator.

3. A magnetic resonance apparatus as claimed in claim 2 wherein said eddy current generator comprises at least one coil arrangement for generating a magnetic gradient field.

4. A magnetic resonance apparatus as claimed in claim 3 wherein said control unit of said eddy current generator comprises a predistortion unit for predistorting a control parameter supplied to said eddy current generator for reducing said eddy currents, and wherein said control unit of said force generator controls said force generator dependent on operation of said predistortion unit.

5. A magnetic resonance apparatus as claimed in claim 1 wherein said electrically conductive structure comprises at least a portion of a magnetic resonance apparatus component selected from the group consisting of a vacuum vessel of said basic field magnet, a cryoshield of said basic field magnet, and a coolant vessel of said basic field magnet.

6. A magnetic resonance apparatus as claimed in claim 1 wherein said electrically conductive structure comprises at least a portion of a magnetic resonance apparatus component selected from the group consisting of a radio-frequency antenna and a radio-frequency shield.

7. A magnetic resonance apparatus as claimed in claim 1 wherein said force generator comprises electrostrictive elements mounted for physical interaction with said at least one electrically conductive structure.

8. A magnetic resonance apparatus as claimed in claim 7 wherein said electrostrictive elements are spatially disposed at said electrically conductive structure with a density corresponding to a relative density of said Lorentz forces.

9. A magnetic resonance apparatus as claimed in claim 7 wherein said electrostrictive elements comprise electrostrictive fibers.

10. A magnetic resonance apparatus as claimed in claim 1 comprising at least one sensor for detecting a magnetic field generated by said eddy currents.

11. A magnetic resonance apparatus as claimed in claim 10 wherein said at least one sensor is connected to said force generator, and wherein said force generator generates said forces for counteracting said Lorentz forces dependent on said magnetic field detected by said at least one sensor.

* * * * *